(12) United States Patent
Zhou et al.

(10) Patent No.: US 9,305,994 B2
(45) Date of Patent: Apr. 5, 2016

(54) SEMICONDUCTOR APPARATUS WITH MULTI-LAYER CAPACITANCE STRUCTURE

(71) Applicant: UNITED MICROELECTRONICS CORP., Hsinchu (TW)

(72) Inventors: Zhi-Biao Zhou, Singapore (SG); Shao-Hui Wu, Singapore (SG); Chi-Fa Ku, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 42 days.

(21) Appl. No.: 14/445,416

(22) Filed: Jul. 29, 2014

(65) Prior Publication Data

US 2015/0357397 A1  Dec. 10, 2015

(30) Foreign Application Priority Data

Jun. 5, 2014  (CN) .......................... 2014 1 0247121

(51) Int. Cl.
*H01L 49/02* (2006.01)
(52) U.S. Cl.
CPC ...................................... *H01L 28/40* (2013.01)
(58) Field of Classification Search
None
See application file for complete search history.

(56) References Cited

U.S. PATENT DOCUMENTS

| | | | |
|---|---|---|---|
| 6,724,611 B1 * | 4/2004 | Mosley | H01G 4/228 257/E27.116 |
| 6,746,929 B2 | 6/2004 | Yoshitomi et al. | |
| 6,838,717 B1 | 1/2005 | Yen et al. | |
| 7,915,134 B2 * | 3/2011 | Chinthakindi | H01L 28/40 438/250 |
| 7,989,919 B2 | 8/2011 | Boeck et al. | |
| 8,618,634 B2 * | 12/2013 | Kageyama | H01L 28/75 257/532 |
| 2005/0116276 A1 | 6/2005 | Gau | |
| 2006/0138595 A1 * | 6/2006 | Kiyotoshi | H01L 21/8221 257/532 |
| 2007/0141776 A1 | 6/2007 | Chen et al. | |
| 2012/0199946 A1 * | 8/2012 | Kageyama | H01L 28/75 257/532 |
| 2013/0051126 A1 * | 2/2013 | Kwong | H01G 4/30 365/149 |
| 2014/0091431 A1 * | 4/2014 | Kageyama | H01L 28/60 257/532 |
| 2015/0295019 A1 * | 10/2015 | Wang | H01L 28/75 257/532 |

* cited by examiner

*Primary Examiner* — Joseph Schoenholtz
(74) *Attorney, Agent, or Firm* — WPAT, PC; Justin King

(57) ABSTRACT

A semiconductor apparatus including a stacked capacitance structure is provided. The stacked capacitance structure includes a first inner metal layer having a first pad area adjacent to an edge of the first inner metal layer, a first insulating layer disposed on the first inner metal layer and exposing the first pad area, a second inner metal layer disposed on the first insulating layer and having a second pad area adjacent to an edge of the second inner metal layer, a second insulating layer disposed on the second inner metal layer and exposing the second pad area, and a third inner metal layer covering the second inner metal layer and including at least one first slit. The first pad area and the second pad area include a plurality of pads. The first slit corresponds to the second pad area, such that the pads on the second pad area are exposed.

18 Claims, 5 Drawing Sheets

US 9,305,994 B2

SEMICONDUCTOR APPARATUS WITH MULTI-LAYER CAPACITANCE STRUCTURE

This application claims the benefit of People's Republic of China application Serial No. 201410247121.6, filed Jun. 5, 2014, the disclosure of which is incorporated by reference herein in its entirety.

BACKGROUND

1. Technical Field

The disclosure relates in general to a semiconductor apparatus, and more particularly to a semiconductor apparatus having a multi-layer capacitance structure.

2. Description of the Related Art

Generally, the semiconductor apparatus may have capacitance density between 7 and 10 $fF/\mu m^2$ nowadays. However, customers request the semiconductor apparatus to have capacitance density more than 16 $fF/um^2$. Due to the limited process during development stage, a stacked MIMCAP structure would be used to further improve capacitance density with similar process.

SUMMARY

The disclosure is directed to a semiconductor apparatus having a multi-layer stacked capacitance structure formed by simple manufacturing processes, which may improve capacitance density of the semiconductor apparatus effectively.

According to one embodiment, a semiconductor apparatus including a stacked capacitance structure is provided. The stacked capacitance structure includes a first inner metal layer having a first pad area adjacent to an edge of the first inner metal layer, a first insulating layer disposed on the first inner metal layer and exposing the first pad area, a second inner metal layer disposed on the first insulating layer and having a second pad area adjacent to an edge of the second inner metal layer, a second insulating layer disposed on the second inner metal layer and exposing the second pad area, and a third inner metal layer covering the second inner metal layer and including at least one first slit. The first pad area and the second pad area include a plurality of pads. The first slit corresponds to the second pad area, such that the pads on the second pad area are exposed.

According to another embodiment, a semiconductor apparatus including a stacked capacitance structure is provided. The stacked capacitance structure includes a first inner metal layer having a first pad area adjacent to an edge of the first inner metal layer, a first insulating layer disposed on the first inner metal layer and exposing the first pad area, a second inner metal layer disposed on the first insulating layer and having a second pad area adjacent to an edge of the second inner metal layer, a second insulating layer disposed on the second inner metal layer and exposing the second pad area, a third inner metal layer disposed on the second insulating layer and having a third pad area adjacent to an edge of the third inner metal, a third insulating layer disposed on the third inner metal layer and exposing the third pad area, and a fourth inner metal layer disposed on the third insulating layer. The first pad area, the second pad area, and the third pad area include a plurality of pads. The third inner metal layer includes at least one first slit corresponding to the first pad area or the second pad area, such that the pads on the first pad area or on the second pad area are exposed.

Figure 1:
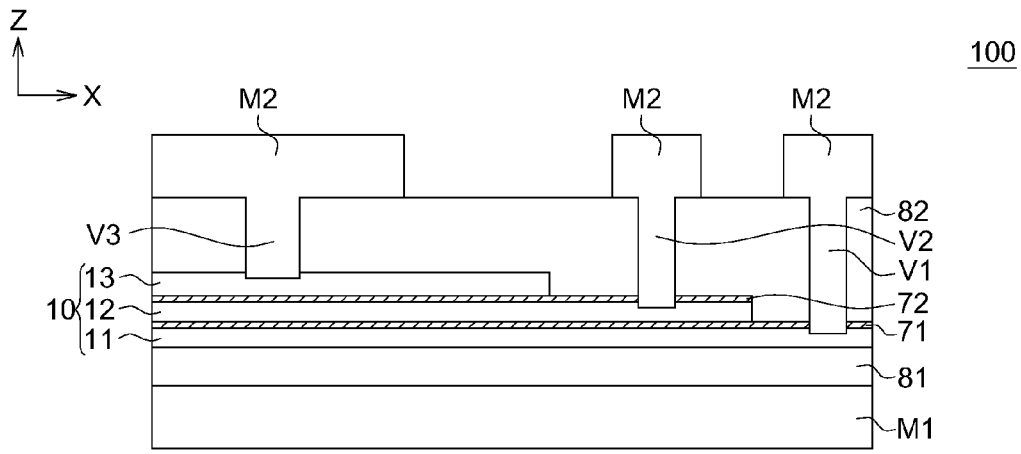
FIG. 1 illustrates a partial cross-sectional view of the semiconductor apparatus according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are to be regarded as an illustrative sense rather than a restrictive sense.

FIG. 1 illustrates a partial cross-sectional view of the semiconductor apparatus 100 according to an embodiment of the disclosure. As shown in FIG. 1, the semiconductor apparatus 100 includes a stacked capacitance structure 10. The stacked capacitance structure 10 includes a first inner metal layer 11, a first insulating layer 71, a second inner metal layer 12, a second insulating layer 72 and a third inner metal layer 13. In this embodiment, the first inner metal layer 11, the second inner metal layer 12 and the third inner metal layer 13 have a first pad area, a second pad area and a third pad area respectively. These pad areas correspond to the positions of bottom portion of vias V1, V2 and V3 respectively as shown in FIG. 1, and include a plurality of pads (not shown).

Besides, the first insulating layer 71 is disposed between the first inner metal layer 11 and the second inner metal layer 12, and the second insulating layer 72 is disposed between the second inner metal layer 12 and the third inner metal layer 13. The first insulating layer 71 and the second insulating layer 72 is formed to electrically insulate the first inner metal layer 11, the second inner metal layer 12 and the third inner metal layer 13 from one another.

The semiconductor apparatus 100 according to the embodiment of the disclosure further includes a first outer metal layer M1, a second outer metal layer M2 parallel with the first outer metal layer M1, a first dielectric structure 81 and a second dielectric structure 82. The first dielectric structure 81 and the second dielectric structure 82 are disposed between the first outer metal layer M1 and the second outer metal layer M2. Further, the stacked capacitance structure 10 is disposed between the first dielectric structure 81 and the second dielectric structure 82.

In this embodiment, the second inner metal layer 12 does not cover the first pad area, and the third inner metal layer 13 does not cover the second pad area. Besides, the first insulating layer 71 and the second insulating layer 72 are patterned, such that the first pad area and the second pad area are exposed. That is, the pads on the first pad area may be connected to the second outer metal layer M2 by the first via V1, the pads on the second pad area may be connected to the second outer metal layer M2 by the second via V2, and the pads on the third pad area may be connected to the second outer metal layer M2 by the third via V3 in the semiconductor apparatus 100 of the embodiment.

Figure 2:
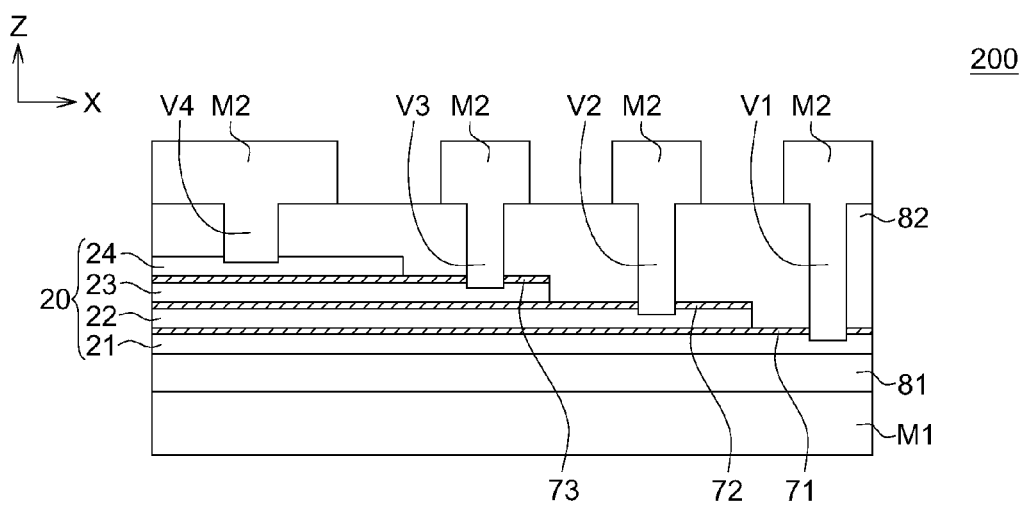
FIG. 2 illustrates a partial cross-sectional view of the semiconductor apparatus according to an embodiment of the disclosure.

FIG. 2 illustrates a partial cross-sectional view of the semiconductor apparatus 200 according to an embodiment of the disclosure. As shown in FIG. 2, the semiconductor apparatus 200 includes a stacked capacitance structure 20 similar to the stacked capacitance structure 10 in FIG. 1. The stacked capacitance structure 20 includes a first inner metal layer 21, a first insulating layer 71, a second inner metal layer 22, a second insulating layer 72 and a third inner metal layer 23. In this embodiment, the stacked capacitance structure 20 further includes a third insulating layer 73 and a fourth inner metal layer 24. The fourth inner metal layer 24 has a fourth pad area corresponding to the position of the bottom portion of via V4 as show in FIG. 2, and includes a plurality of pads (not shown). The third insulating layer 73 is disposed between the third inner metal layer 23 and the fourth inner metal layer 24. The detailed description of other elements similar to the structure shown in FIG. 1 would be omitted here.

Similarly, the fourth inner metal layer 24 in this embodiment does not cover the third pad area and the third insulating layer 73 is patterned, such that the third pad area is exposed. That is, the pads on the first pad area may be connected to the second outer metal layer M2 by the first via V1, the pads on the second pad area may be connected to the second outer metal layer M2 by the second via V2, the pads on the third pad area may be connected to the second outer metal layer M2 by the third via V3, and the pads on the fourth pad area may be connected to the second outer metal layer M2 by the fourth via V4 in the semiconductor apparatus 200 of the embodiment.

Figure 3A:
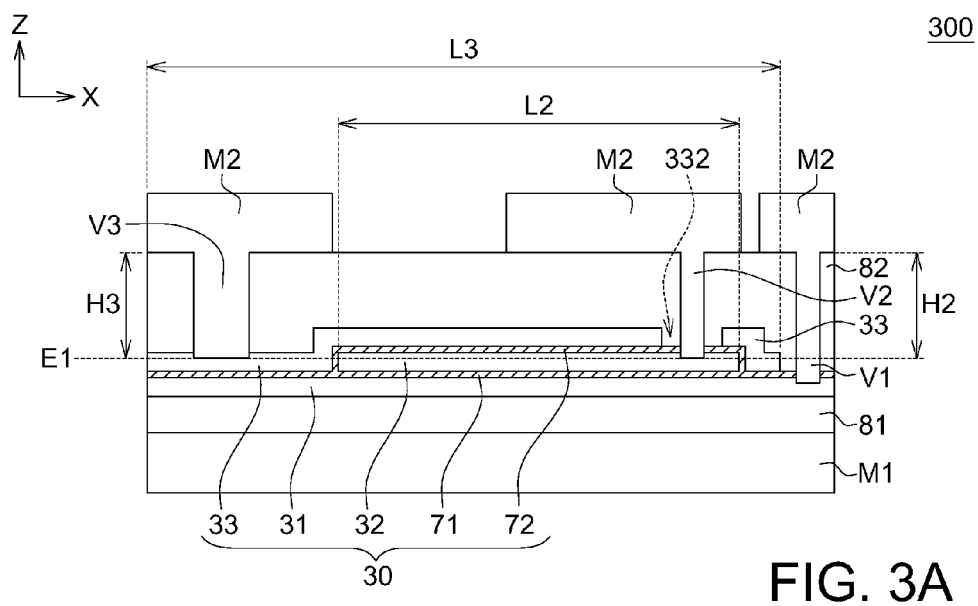
FIG. 3A illustrates a partial cross-sectional view (in X-Z plane) of the semiconductor apparatus according to an embodiment of the disclosure.
Figure 3B:
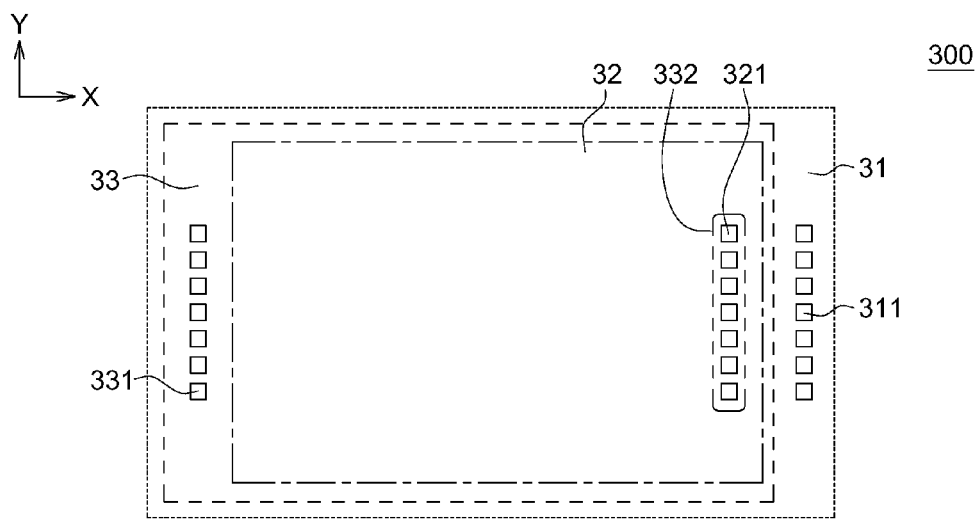
FIG. 3B illustrates a top perspective view (in X-Y plane) of the semiconductor apparatus according to an embodiment of the disclosure.

FIG. 3A illustrates a partial cross-sectional view (in X-Z plane) of the semiconductor apparatus 300 according to an embodiment of the disclosure. FIG. 3B illustrates a top perspective view (in X-Y plane) of the semiconductor apparatus 300 according to an embodiment of the disclosure. It should be noted that the insulating layers in FIG. 3B are omitted for convenience of explanation, and different inner metal layers are shown by different line segments.

As shown in FIGS. 3A and 3B, the semiconductor apparatus 300 includes a stacked capacitance structure 30 including a first inner metal layer 31, a first insulating layer 71, a second inner metal layer 32, a second insulating layer 72 and a third inner metal layer 33.

In this embodiment, the first inner metal layer 31 has a first pad area adjacent to an edge of the first inner metal layer 31, and the first pad area includes a plurality of pads 311. The first insulating layer 71 is disposed on the first inner metal layer 31 and exposes the first pad area. The second inner metal layer 32 is disposed on the first insulating layer 71 and has a second pad area adjacent to an edge of the second inner metal layer 32. The second pad area includes a plurality of pads 321. The second insulating layer 72 is disposed on the second inner metal layer 32 and exposes the second pad area. The third inner metal layer 33 covers the second inner metal layer 32 and includes a first slit 322 corresponding to the second pad area, such that the pads 321 on the second pad area are exposed.

In this embodiment, that the third inner metal layer 33 covers the second inner metal layer 32 represents that an width L3 of the third inner metal layer 33 is larger than a width L2 of the second inner metal layer 32. The third inner metal layer 33 may have a third pad area including a plurality of pads 331.

Further, the first pad area with pads 311 is adjacent to the right edge of the first inner metal layer 31, the second pad area with pads 321 is adjacent to the right edge of the second inner metal layer 32, and the third pad area with pads 331 is adjacent to the left edge of the third inner metal layer 33. That is, the first pad area and the second pad area are disposed on one side, and the third pad area is disposed on another side opposed to the first pad area and the second pad area in the stacked capacitance structure 30.

As shown in FIG. 3A, the third inner metal layer 33 is extended and covers the second inner metal layer 32, such that the third pad area and the second pad area may be coplanar. For example, the second pad area and the third pad area are coplanar with plane E1 shown in FIG. 3A.

The following description takes the stacked capacitance structure 30 as an example to show the manufacturing method of the stacked capacitance structure. The manufacturing method of the stacked capacitance structure 30 may include the following steps.

A first inner metal layer 31 is deposited.

A first insulating layer 71 is formed on the first inner metal layer 31, and patterned to exposed portion of the first inner metal layer 31 (for corresponding to the first pad area).

A second inner metal layer 32 is deposited on the first insulating layer 71.

The second inner metal layer 32 is patterned.

A second insulating layer 72 is formed on the patterned second inner metal layer 32, and patterned to expose portion of the second inner metal layer 32 (for corresponding to the second pad area).

A third inner metal layer 33 is deposited, and covers the patterned second inner metal layer 32 and the second insulating layer 72.

The third inner metal layer 33 is patterned to form a first slit 332 corresponding to the second pad area (such that the pads 321 on the second pad area are exposed).

Although the manufacturing method of the stacked capacitance structure 30 has been described by the simple steps above, however, the disclosure is not limited thereto. It should be understood that the manufacturing method of the stacked capacitance structure 30 according to the embodiment of the disclosure may include other process steps. Besides, the "patterning" process described above may include, for example, a photolithography process.

Furthermore, the semiconductor apparatus 300 according to the embodiment of the disclosure may further include a first outer metal layer M1, a second outer metal layer M2 parallel with the first outer metal layer M1, a first dielectric structure 81 and a second dielectric structure 82. As shown in FIG. 3A, the first dielectric structure 81 and the second dielectric structure 82 are disposed between the first outer metal layer M1 and the second outer metal layer M2. In this embodiment, the stacked capacitance structure 30 is disposed between the first dielectric structure 81 and the second dielectric structure 82.

Besides, the semiconductor apparatus 300 may further include at least one first via V1, at least one second via V2 and at least one third via V3. The first via V1 penetrates the second dielectric layer 82 and connects the pads 311 on the first pad area to the second outer metal layer M2, the second via V2 penetrates the second dielectric layer 82 and connects the pads 321 on the second pad area to the second outer metal layer M2, and the third via V3 penetrates the second dielectric layer 82 and connects the pads 331 on the third pad area to the second outer metal layer M2. Through the connections by the first via V1, the second via V2 and the third via V3, it would be easy to electrically connect the first inner metal layer 31, the second inner metal layer 32 and the third inner metal layer to other electrical elements.

In this embodiment, the third inner metal layer 33 is extended and covers the second inner metal layer 32, such that the third pad area and the second pad area may be coplanar with plane E1 as shown in FIG. 3A. Therefore, a height H2 of the second via V2 may be the same as a height H3 of the third via V3.

Figure 3C:
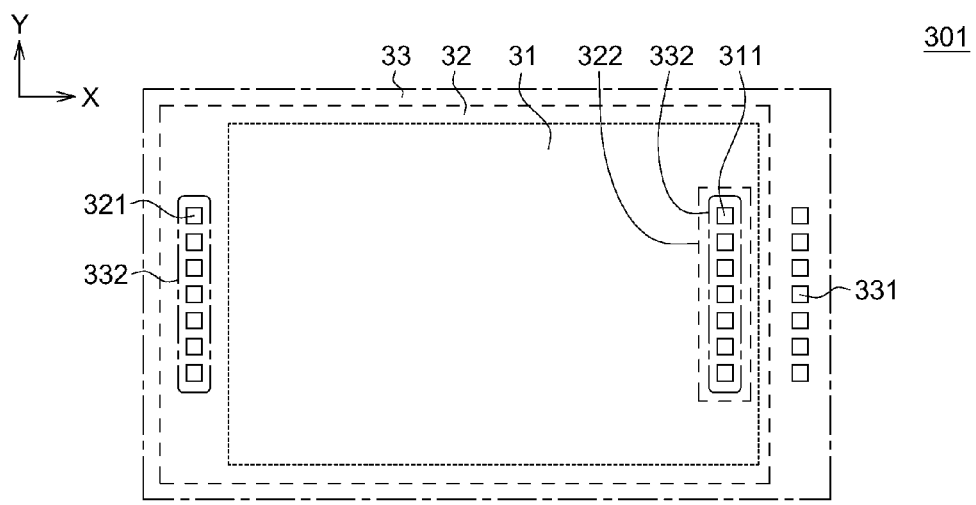
FIG. 3C illustrates a top perspective view (in X-Y plane) of the semiconductor apparatus according to another embodiment of the disclosure.

The embodiment of the disclosure is described by FIGS. 3A and 3B above, but the disclosure is not limited thereto. FIG. 3C illustrates a top perspective view (in X-Y plane) of the semiconductor apparatus 301 according to another embodiment of the disclosure. Similarly, the insulating layers in FIG. 3C are omitted for convenience of explanation, and different inner metal layers are shown by different line segments.

Besides, although the corresponding cross-sectional view of the structure in FIG. 3C is not shown, the stacking order of layers of the structure in FIG. 3C is similar to the structure shown in FIG. 3A.

The difference between the semiconductor apparatus 301 (shown in FIG. 3C) and the semiconductor apparatus 300 (shown in FIG. 3B) is that the second inner metal layer 32 of the semiconductor apparatus 301 covers the first inner metal layer 31 and includes a second slit 322 corresponding to the first pad area having the pads 311, such that the pads 311 on the first pad area are exposed. That is, the second inner metal layer 32 is extended and covers the first pad area of the first inner metal layer 31, and exposes the pads 311 by the second slit 322.

Besides, since the third inner metal layer 33 covers the second inner metal layer 32, the first slit 332 of the third inner metal layer 33 has to correspond to the second slit 322, such that the pads 311 on the first pad area may be exposed.

According to the description above, the first pad area, the second pad area and the third pad area may be coplanar in this embodiment. That is, heights of the first via V1, the second via V2 and the third via V3 for respectively connecting the first pad area, the second pad area and the third pad area to the second outer metal layer M2 may be the same.

Further, the manufacturing method of the semiconductor apparatus 301 includes the process steps similar to that of the semiconductor apparatus 300, and would be omitted here.

Although the third inner metal layer 33 includes pads 331 in the embodiments described above, the disclosure is not limited thereto. In some embodiments, the third inner metal layer 33 may include no pad, and is used as a shielding layer of the semiconductor apparatus.

Figure 4A:
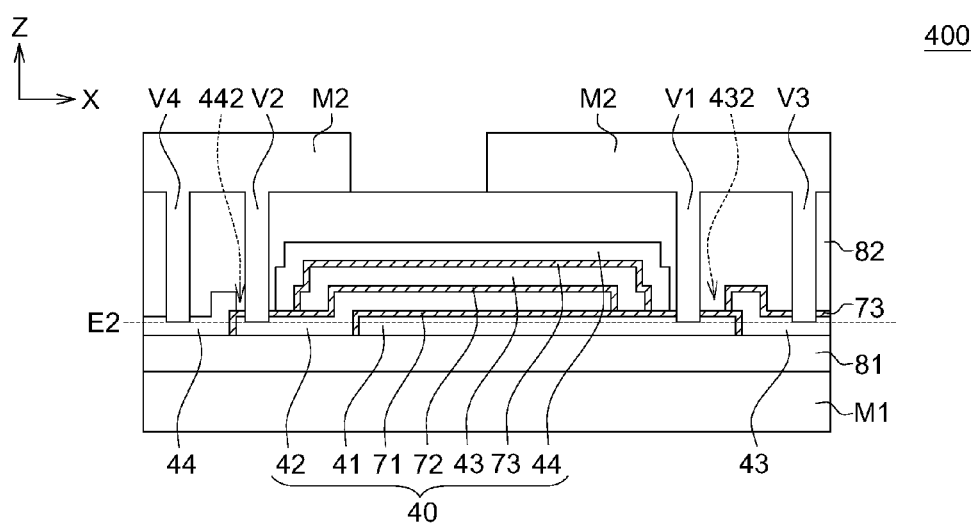
FIG. 4A illustrates a partial cross-sectional view (in X-Z plane) of the semiconductor apparatus according to an embodiment of the disclosure.
Figure 4B:
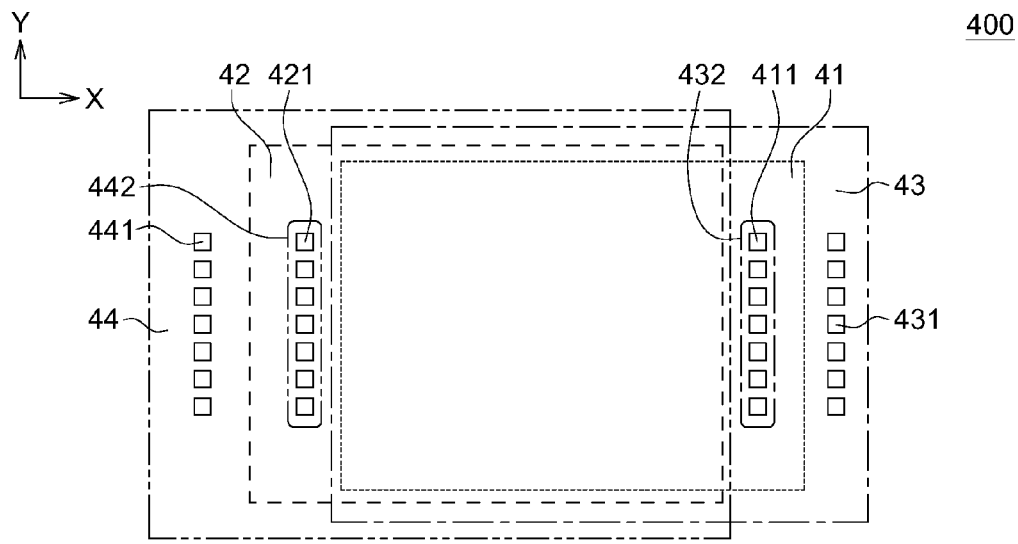
FIG. 4B illustrates a top perspective view (in X-Y plane) of the semiconductor apparatus according to an embodiment of the disclosure.

FIG. 4A illustrates a partial cross-sectional view (in X-Z plane) of the semiconductor apparatus 400 according to an embodiment of the disclosure. FIG. 4B illustrates a top perspective view (in X-Y plane) of the semiconductor apparatus 400 according to an embodiment of the disclosure. It should be noted that the insulating layers in FIG. 4B are omitted for convenience of explanation, and different inner metal layers are shown by different line segments.

As shown in FIGS. 4A and 4B, the semiconductor apparatus 400 includes a stacked capacitance structure 40 including a first inner metal layer 41, a first insulating layer 71, a second inner metal layer 42, a second insulating layer 72, a third inner metal layer 43, a third insulating layer 72 and a fourth inner metal layer 44.

In this embodiment, the first inner metal layer 41 has a first pad area adjacent to an edge of the first inner metal layer 41, and the first pad area includes a plurality of pads 411. The first insulating layer 71 is disposed on the first inner metal layer 41 and exposes the first pad area. The second inner metal layer 42 is disposed on the first insulating layer 71 and has a second pad area adjacent to an edge of the second inner metal layer 42. The second pad area includes a plurality of pads 421. The second insulating layer 72 is disposed on the second inner metal layer 42 and exposes the second pad area. The third inner metal layer 43 is disposed on the second insulating layer 72 and has a third pad are adjacent to an edge of the third inner metal layer 43. The third inner metal layer 43 includes at least one first slit 432 corresponding to the first pad are, such that the pads 411 on the first pad area are exposed. The third insulating layer 73 is disposed on the third inner metal layer 43 and exposes the third pad area. The fourth inner metal layer 44 is disposed on the third insulating layer 73.

As shown in FIG. 4B, the fourth inner metal layer 44 in the embodiment of the disclosure may have a fourth pad area including a plurality of pads 441. In this embodiment, the third inner metal layer 43 is extended and covers the first inner metal layer 41, and the first slit 432 corresponds to the first pad area, such that the pads 411 on the first pad area are exposed. Besides, the fourth inner metal layer 44 is extended and covers the second inner metal layer 42, and the fourth inner metal layer 44 includes a second slit 442 corresponding to the second pad area, such that the pads 421 on the second pad area are exposed.

Further, the first pad area with pads 411 is adjacent to the right edge of the first inner metal layer 41, the second pad area with pads 421 is adjacent to the left edge of the second inner metal layer 42, the third pad area with pads 431 is adjacent to the right edge of the third inner metal layer 43, and the fourth pad area with pads 441 is adjacent to the left edge of the fourth inner metal layer 44. That is, the first pad area and the third pad area are disposed on one side, and the second pad area and the fourth pad area are disposed on another side opposed to the first pad area and the third pad area in the stacked capacitance structure 40.

As shown in FIGS. 4A and 4B, because of the design of the first slit 432 and the second slit 422 and the extending structures of the third inner metal layer 43 and the fourth inner metal layer 44, the first pad area, the second pad area, the third pad area and the fourth pad area of the semiconductor apparatus 40 may be coplanar. For example, the first pad area, the second pad area, the third pad area and the fourth pad area of the semiconductor apparatus 40 may be coplanar with plane E2 as shown in FIG. 4A.

Furthermore, the semiconductor apparatus 400 according to the embodiment of the disclosure may further include a first outer metal layer M1, a second outer metal layer M2 parallel with the first outer metal layer M1, a first dielectric structure 81 and a second dielectric structure 82. As shown in FIG. 4A, the first dielectric structure 81 and the second dielectric structure 82 are disposed between the first outer metal layer M1 and the second outer metal layer M2. In this embodiment, the stacked capacitance structure 40 is disposed between the first dielectric structure 81 and the second dielectric structure 82.

Besides, the semiconductor apparatus 400 may further include at least one first via V1, at least one second via V2, at least one third via V3, and at least one fourth via V4. The first via V1 penetrates the second dielectric layer 82 and connects the pads 411 on the first pad area to the second outer metal layer M2, the second via V2 penetrates the second dielectric layer 82 and connects the pads 421 on the second pad area to the second outer metal layer M2, the third via V3 penetrates the second dielectric layer 82 and connects the pads 431 on the third pad area to the second outer metal layer M2, and the fourth via V4 penetrates the second dielectric layer 82 and connects the pads 441 on the fourth pad area to the second outer metal layer M2. Through the connections by the first via V1, the second via V2, the third via V3 and the fourth via V4, it would be easy to electrically connect the first inner metal layer 41, the second inner metal layer 42, the third inner metal layer 43, and the fourth inner metal layer 44 to other electrical elements.

In this embodiment, since the first pad area, the second pad area, the third pad area and the fourth pad area may be coplanar with plane E2 as shown in FIG. 4A, heights of the first via V1, the second via V2, the third via V3 and the fourth via V4 may be the same.

Figure 4C:
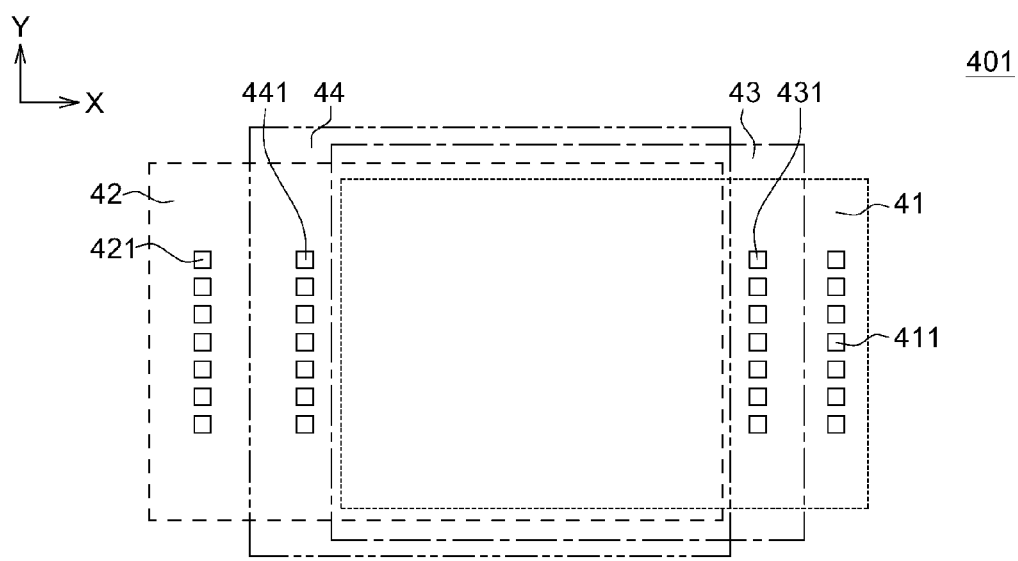
FIG. 4C-4E illustrate a top perspective view (in X-Y plane) of the semiconductor apparatus according to other embodiments of the disclosure.
Figure 4D:
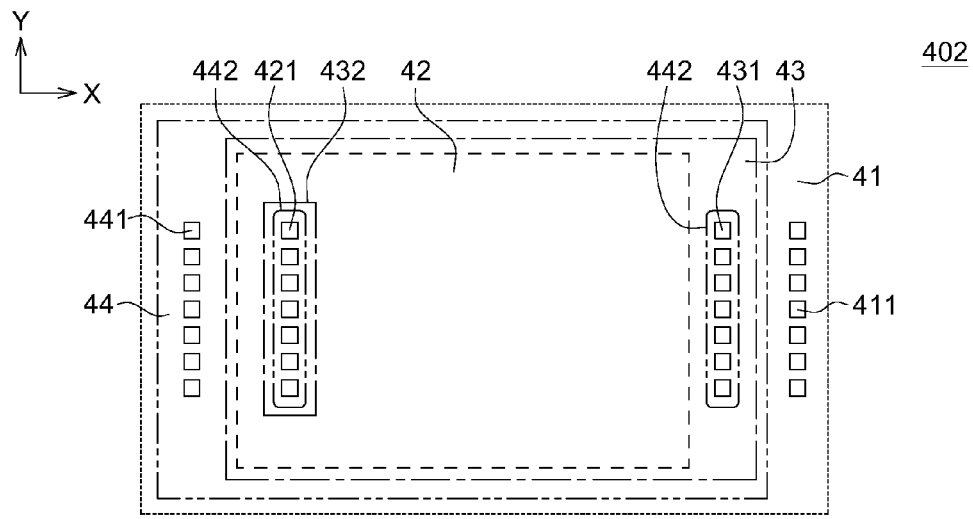
Figure 4E:
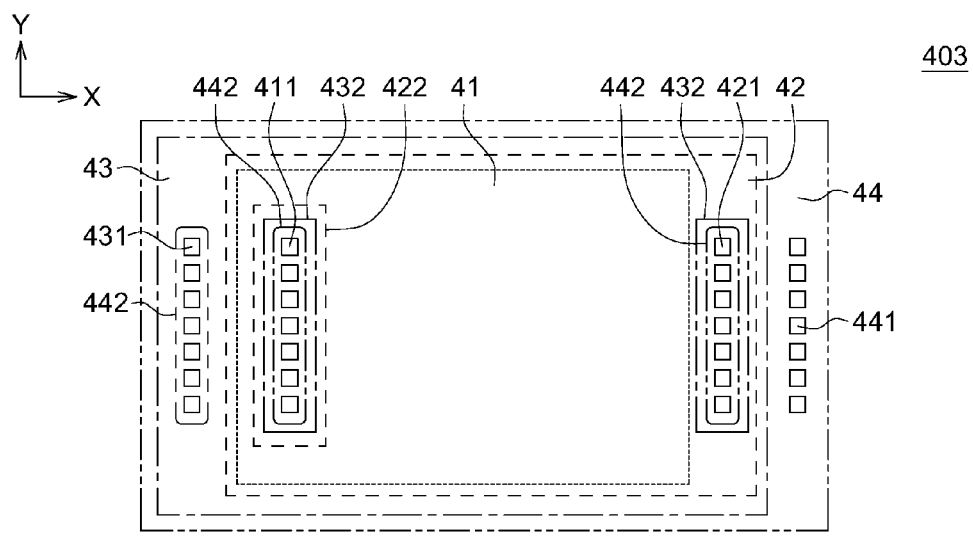

FIG. 4C-4E illustrate a top perspective view (in X-Y plane) of the semiconductor apparatus 401, 402, 403 according to other embodiments of the disclosure. Similarly, the insulating layers in FIG. 4C-4E are omitted for convenience of explanation, and different inner metal layers are shown by different line segments.

Besides, although the corresponding cross-sectional view of the structure in FIG. 4C-4E are not shown, the stacking order of layers of the structure in FIG. 4C-4E are similar to the structure shown in FIG. 4A.

As shown in FIG. 4C, the first pad area with pads 411, the second pad area with pads 421, the third pad area with pads 431 and the fourth pad area with pads 441 are not covered by other inner metal layers in the semiconductor apparatus 401. Therefore, the first inner metal layer 41, the second inner metal layer 42, the third inner metal layer 43 and the fourth inner metal layer 44 may be electrically connected to other electrical elements by the pads 411, 421, 431 and 441 respectively.

As shown in FIG. 4D, the third inner metal layer 43 is extended and covers the second inner metal layer 42 in the semiconductor apparatus 402. The third inner metal layer 43 includes the first slit 432 corresponding to the second pad area with pads 421, such that the pads 421 on the second pad area are exposed.

Besides, the fourth inner metal layer 44 is extended and covers the third inner metal layer 43. The fourth inner metal layer 44 includes two second slits 442. One of the two second slit 442 corresponds to the third pad area with pads 431, such that the pads 431 on the third pad area are exposed. Another one of the two second slit 442 corresponds to the first slit 432, such that the pads 421 on the second pad area are exposed.

As shown in FIG. 4E, in the semiconductor apparatus 403, the fourth inner metal layer 44 is extended and covers the third inner metal layer 43, the third inner metal layer 43 is extended and covers the second inner metal layer 42, and the second inner metal layer 42 is extended and covers the first inner metal layer 41.

In this embodiment, the third inner metal layer 43 includes two first slits 432, the fourth inner metal layer 44 includes two second slits 442, and the second inner metal layer 42 includes a third slit 422. The second slit 442 exposes the pads 431 on the third pad area. The first slit 432, the second slit 442 and the third slit 422 expose the pads 411 on the first pad area. The first slit 432 and the second slit 442 expose the pads 421 on the second pad area.

In the embodiments of the disclosure, the first dielectric structure 81 and the second dielectric structure 82 may include nitrogen (N), oxygen (O), carbon (C) or other materials with low permittivity (κ). Further, the first insulating layer 71, the second insulating layer 72 and the third insulating layer 73 may include hafnium dioxide ($HfO_2$), aluminum oxide ($AlO_3$) or other materials with high permittivity (κ).

Although the disclosure is described by the embodiments, the disclosure is not limited to the structure mentioned above. The structures according to the embodiments of the disclosure include stacked inner metal layers and would improve the capacitance density effectively by extending, covering the inner metal layers and the design of the slits.

The semiconductor apparatus according to the embodiments of the disclosure may get double, triple or even higher capacitance density compared with the conventional semiconductor apparatus. Besides, the semiconductor apparatus according to the embodiments of the disclosure may be applied to the structures coupled in parallel or series. With the use of high dielectric constant material, the capacitance density of the semiconductor apparatus according to the embodiments of the disclosure may achieve about 40-60 $fF/\mu m^2$ or higher.

Furthermore, the positions of the vias and the pads, and the via aspect ratio in the disclosure may be simply controlled by the process for manufacturing the stacked metal structure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor apparatus, comprising:
    a stacked capacitance structure, comprising:
        a first inner metal layer having a first pad area adjacent to an edge of the first inner metal layer, wherein the first pad area comprises a plurality of pads;
        a first insulating layer disposed on the first inner metal layer and exposing the first pad area;
        a second inner metal layer disposed on the first insulating layer and having a second pad area adjacent to an edge of the second inner metal layer, wherein the second pad area comprises a plurality of pads;
        a second insulating layer disposed on the second inner metal layer and exposing the second pad area; and
        a third inner metal layer covering the second inner metal layer and comprising at least one first slit, wherein the first slit corresponds to the second pad area, such that the pads on the second pad area are exposed,
    wherein the second inner metal layer covers the first inner metal layer and comprises at least one second slit corresponding to the second pad area, such that the pads on the second pad area are exposed.

2. The semiconductor apparatus according to claim 1, wherein the third inner metal layer has a third pad area, and the third pad area comprises a plurality of pads.

3. The semiconductor apparatus according to claim 2, wherein the second inner metal layer comprises another second slit corresponding to the first slit, such that the pads on the first pad area are exposed.

4. The semiconductor apparatus according to claim 3, wherein the first pad area, the second pad area, and the third pad area are coplanar.

5. The semiconductor apparatus according to claim 1, further comprising:
    a first outer metal layer;

a second outer layer parallel with the first outer metal layer; and a first dielectric structure and a second dielectric structure disposed between the first outer metal layer and the second metal outer layer;

wherein the stacked capacitance structure is disposed between the first dielectric layer and the second dielectric layer.

6. The semiconductor apparatus according to claim 5, further comprising:

at least one first via connecting the pads on the first pad area to the second outer metal layer; and at least one second via connecting the pads on the second pad area to the second outer metal layer.

7. The semiconductor apparatus according to claim 5, wherein the first dielectric structure and the second dielectric structure comprises nitrogen, oxygen, carbon or other materials with low permittivity (K).

8. The semiconductor apparatus according to claim 1, wherein the first insulating layer and the second insulating layer comprises hafnium dioxide, aluminum oxide or other materials with high permittivity (K).

9. A semiconductor apparatus, comprising:

a stacked capacitance structure, comprising:

a first inner metal layer having a first pad area adjacent to an edge of the first inner metal layer, wherein the first pad area comprises a plurality of pads;

a first insulating layer disposed on the first inner metal layer and exposing the first pad area;

a second inner metal layer disposed on the first insulating layer and having a second pad area adjacent to an edge of the second inner metal layer, wherein the second pad area comprises a plurality of pads;

a second insulating layer disposed on the second inner metal layer and exposing the second pad area;

a third inner metal layer disposed on the second insulating layer and having a third pad area adjacent to an edge of the third inner metal, wherein the third pad area comprises a plurality of pads, and the third inner metal layer comprises at least one first slit corresponding to the first pad area or the second pad area, such that the pads on the first pad area or on the second pad area are exposed;

a third insulating layer disposed on the third inner metal layer and exposing the third pad area; and a fourth inner metal layer disposed on the third insulating layer, wherein the fourth inner metal layer covers the second inner metal layer and comprises a second slit corresponding to the second pad area, such that the pads on the second pad area are exposed.

10. The semiconductor apparatus according to claim 9, wherein the first pad area, the second pad area, and the third pad area are coplanar.

11. The semiconductor apparatus according to claim 9, wherein the fourth inner metal layer has a fourth pad area comprising a plurality of pads.

12. The semiconductor apparatus according to claim 9, wherein the third inner metal layer covers the first inner metal layer and the first slit corresponds to the first pad area, such that the pads on the first pad area are exposed.

13. The semiconductor apparatus according to claim 9, wherein the third inner metal layer covers the second inner metal layer, and the first slit corresponds to the second pad area, such that the pads on the second pad area are exposed.

14. The semiconductor apparatus according to claim 13, wherein the fourth inner metal layer covers the third inner metal layer and comprises at least one second slit corresponding to the third pad area, such that the pads on the third pad area are exposed.

15. The semiconductor apparatus according to claim 14, wherein the fourth inner metal layer further comprises another second slit corresponding to the first slit, such that the pads on the second pad area are exposed.

16. The semiconductor apparatus according to claim 13, wherein the second inner metal layer covers the first inner metal layer and comprises at least one third slit;

the fourth inner metal layer covers the third inner metal layer and comprises at least one second slit exposing the pads on the third pad area;

the first slit, the second slit, and the third slit expose the pads on the first pad area;

the first slit and the second slit exposed the pads on the second pad area.

17. The semiconductor apparatus according to claim 9, further comprising:

a first outer metal layer;

a second outer layer parallel with the first outer metal layer; and a first dielectric structure and a second dielectric structure disposed between the first outer metal layer and the second metal outer layer;

wherein the stacked capacitance structure is disposed between the first dielectric layer and the second dielectric layer.

18. The semiconductor apparatus according to claim 17, further comprising:

at least one first via connecting the pads on the first pad area to the second outer metal layer;

at least one second via connecting the pads on the second pad area to the second outer metal layer; and at least one third via connecting the pads on the third pad area to the second outer metal layer.

* * * * *